United States Patent
Liu et al.

(10) Patent No.: US 11,177,092 B1
(45) Date of Patent: Nov. 16, 2021

(54) KEYBOARD DEVICE AND KEY STRUCTURE THEREOF

(71) Applicant: Primax Electronics Ltd., Taipei (TW)

(72) Inventors: Chien-Hung Liu, Taipei (TW); Chin-Sung Pan, Taipei (TW); Lei-Lung Tsai, Taipei (TW); Chia-Wei Chang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 17/162,403

(22) Filed: Jan. 29, 2021

(30) Foreign Application Priority Data

Nov. 20, 2020 (TW) .................................. 109140849

(51) Int. Cl.
| | |
|---|---|
| *H01H 13/12* | (2006.01) |
| *H01H 13/7065* | (2006.01) |
| *H03K 17/969* | (2006.01) |
| *H01H 3/12* | (2006.01) |

(52) U.S. Cl.
CPC .......... *H01H 13/7065* (2013.01); *H01H 3/12* (2013.01); *H03K 17/969* (2013.01)

(58) Field of Classification Search
CPC ...... H01H 3/125; H01H 13/705; H01H 13/14; H01H 13/70; H01H 13/704; H01H 13/7065; H01H 13/7006; H01H 13/7057; H01H 13/78; H01H 13/79; H01H 13/52; H01H 13/703; H01H 13/507; H03K 17/969; H03K 17/968; H03K 17/943; H03K 17/9629; H03K 17/9631; H03K 17/9638; H01L 13/14; H01L 13/26
See application file for complete search history.

(56) References Cited

U.S. PATENT DOCUMENTS

| | | | | |
|---|---|---|---|---|
| 6,750,406 B2* | 6/2004 | Komatsu | ................ | H01H 21/22 200/1 B |
| 7,268,305 B2* | 9/2007 | Schmidt | ............... | H01H 23/003 200/1 B |
| 7,507,923 B2* | 3/2009 | Azizi | ................... | H01H 23/003 200/295 |
| 8,314,352 B2* | 11/2012 | Huang | .................. | G06F 3/0202 200/1 B |

(Continued)

*Primary Examiner* — Ahmed M Saeed
(74) *Attorney, Agent, or Firm* — Kirton McConkie; Evan R. Witt

(57) ABSTRACT

A keyboard device includes plural key structures. Each key structure includes a plate assembly, a keycap assembly, an elastic element, a connecting member and a signal generator. The plate assembly includes a membrane switch. The keycap assembly is located over the plate assembly. The elastic element is arranged between the plate assembly and the keycap assembly. The connecting member is arranged between the plate assembly and the keycap assembly. The connecting member includes a triggering part. The signal generator is installed on the plate assembly. While the keycap assembly is moved toward the plate assembly through the connecting member, the triggering part is moved downwardly to trigger the signal generator to generate a first signal. After the signal generator is triggered, the keycap assembly is continuously moved downwardly and the membrane switch is triggered to generate a second signal.

8 Claims, 11 Drawing Sheets

(56) References Cited

U.S. PATENT DOCUMENTS

| | | | | |
|---|---|---|---|---|
| 8,710,383 B2* | 4/2014 | Chen | ................... | H01H 3/125 |
| | | | | 200/5 A |
| 2014/0001021 A1* | 1/2014 | Zhang | ................... | H01H 3/125 |
| | | | | 200/5 C |

* cited by examiner

KEYBOARD DEVICE AND KEY STRUCTURE THEREOF

FIELD OF THE INVENTION

The present invention relates to an input device, and more particularly to a keyboard device.

BACKGROUND OF THE INVENTION

With increasing development of science and technology, a variety of electronic devices are designed in views of convenience and user-friendliness. For helping the user well operate the electronic devices, the electronic devices are gradually developed in views of humanization. The input devices of the common electronic devices include for example mouse devices, keyboard devices, trackball devices, or the like. Via the keyboard device, texts or symbols can be inputted into the computer system directly. As a consequence, most users and most manufacturers of input devices pay much attention to the development of keyboard devices.

Generally, a keyboard device comprises plural key structures. Each key structure comprises a keycap, a scissors-type connecting member, a membrane circuit board and a supporting plate. These components are stacked on each other sequentially. In case that the keyboard device is a luminous keyboard device, the keyboard device is equipped with a backlight module under the supporting plate.

Moreover, a membrane switch is installed on the membrane circuit board, and an elastic element is arranged between the keycap and the membrane circuit board. The scissors-type connecting member is connected between the keycap and the supporting plate. Moreover, the scissors-type connecting member comprises a first frame and a second frame. The second frame is pivotally coupled to the first frame. Consequently, the first frame and the second frame can be swung relative to each other. While the keycap of any key structure is depressed and moved downwardly relative to the supporting plate, the first frame and the second frame of the scissors-type connecting member are switched from an open-scissors state to a stacked state. Moreover, as the keycap is moved downwardly to compress the elastic element, the corresponding membrane switch is pushed and triggered by the elastic element. Consequently, the keyboard device generates a corresponding key signal.

When the keycap of the key structure is no longer depressed, the keycap is moved upwardly relative to the supporting plate in response to an elastic force of the elastic element. Meanwhile, the first frame and the second frame are switched from the stacked state to the open-scissors state again, and the keycap is returned to its original position.

However, the conventional keyboard device still has some drawbacks. For example, in a general usage status (e.g., the general text inputting task), the conventional keyboard device is only able to generate the corresponding text input signals when the keys at different positions are depressed by the user. That is, whenever a key is clicked, only a signal is generated. If the keyboard device is in the usage status corresponding to the task of playing games, it is necessary to simultaneously depress more than two keys to execute a special control command. In other words, the conventional keyboard device is not user-friendly.

Therefore, there is a need of providing an improved keyboard device in order to overcome the drawbacks of the conventional technologies.

SUMMARY OF THE INVENTION

An object of the present invention provides a keyboard device with a key structure. While a keycap assembly of the key structure is moved downwardly, a triggering part of a connecting member is moved downwardly to trigger a signal generator to generate a first signal. As the keycap assembly is continuously moved downwardly, an elastic element is moved downwardly to trigger a membrane switch to generate a second signal.

Another object of the present invention provides a key structure. While a keycap assembly of the key structure is moved downwardly, a triggering part of a connecting member is moved downwardly to trigger a signal generator to generate a first signal. As the keycap assembly is continuously moved downwardly, an elastic element is moved downwardly to trigger a membrane switch to generate a second signal.

The other objects and advantages of the present invention will be understood from the disclosed technical features.

In accordance with an aspect of the present invention, a keyboard device is provided. The keyboard device includes plural key structures. Each key structure includes a plate assembly, a keycap assembly, an elastic element, a connecting member and a signal generator. The plate assembly includes a membrane switch. The keycap assembly is located over the plate assembly. The elastic element is arranged between the plate assembly and the keycap assembly. The connecting member is arranged between the plate assembly and the keycap assembly. The keycap assembly is movable upwardly or downwardly relative to the plate assembly through the connecting member. The connecting member includes a triggering part. The signal generator is installed on the plate assembly and aligned with the triggering part of the connecting member. While the keycap assembly is moved toward the plate assembly through the connecting member, the triggering part of the connecting member is moved downwardly to trigger the signal generator to generate a first signal. After the signal generator is triggered, the keycap assembly is continuously moved downwardly and the elastic element is moved downwardly to trigger the membrane switch to generate a second signal. The first signal and the second signal are different types of signals.

In an embodiment, the signal generator includes an infrared emitter and an infrared receiver, which are aligned with each other. The infrared emitter emits an infrared ray to the infrared receiver. A region between the infrared emitter and the infrared receiver is defined as a sensing region. The triggering part of the connecting member includes a light-shielding structure. While the keycap assembly is moved downwardly relative to the plate assembly through the connecting member, the light-shielding structure of the connecting member is correspondingly moved to the sensing region. Consequently, the signal generator is triggered to generate the first signal.

In an embodiment, the signal generator includes a first electrode and a second electrode, which are aligned with each other. The triggering part of the connecting member includes a conductive block. While the keycap assembly is moved downwardly relative to the plate assembly through the connecting member, the conductive block of the connecting member is correspondingly moved and contacted with the first electrode and the second electrode, and a conductive loop between the first electrode and the second electrode is established. Consequently, the signal generator is triggered to generate the first signal.

In an embodiment, the elastic element includes a contacting part. While the keycap assembly is moved downwardly through the connecting member, the keycap assembly is moved downwardly to compress the elastic element, and the contacting part is moved downwardly toward the plate assembly. After the signal generator is triggered, the membrane switch is triggered by the contacting part of the elastic element, so that the second signal is generated.

In an embodiment, the first signal is a sound signal, and the second signal is a text input signal.

In an embodiment, the first signal and the second signal are different control signals.

In an embodiment, the plate assembly further includes a membrane wiring board, a supporting assembly, a waterproof plate and a circuit board. The membrane wiring board include the membrane switch and a first opening. The elastic element is arranged between the membrane wiring board and the keycap assembly. The supporting assembly is located over the membrane wiring board. The supporting assembly includes a second opening and a third opening. The second opening and the first opening are in communication with each other to be collaboratively defined as an opening part. The elastic element is penetrated through the third opening and installed on the membrane wiring board. The waterproof plate is located under the membrane wiring board. The circuit board is arranged between the membrane wiring board and the waterproof plate. The signal generator is installed on the circuit board. The signal generator is exposed to the opening part.

In an embodiment, the supporting assembly is a combination of a supporting plate and a supporting frame, and the second opening and the third opening are formed in the supporting frame. The keycap assembly is a combination of a keycap and a covering body. The covering body is embedded in the supporting frame. The covering body is movable upwardly or downwardly relative to the supporting frame. The connecting member is arranged between the supporting frame and the covering body. The elastic element is arranged between the covering body and the membrane wiring board.

In an embodiment, the plate assembly further includes a first adhesive layer, a second adhesive layer and a separation layer. The first adhesive layer is arranged between the supporting assembly and the membrane wiring board. The second adhesive layer is arranged between the membrane wiring board and the separation layer. The separation layer is arranged between the second adhesive layer and the circuit board.

In accordance with another aspect of the present invention, a key structure is provided. The key structure includes a plate assembly, a keycap assembly, an elastic element, a connecting member and a signal generator. The plate assembly includes a membrane switch. The keycap assembly is located over the plate assembly. The elastic element is arranged between the plate assembly and the keycap assembly. The connecting member is arranged between the plate assembly and the keycap assembly. The keycap assembly is movable upwardly or downwardly relative to the plate assembly through the connecting member. The connecting member includes a triggering part. The signal generator is installed on the plate assembly and aligned with the triggering part of the connecting member. While the keycap assembly is moved toward the plate assembly through the connecting member, the triggering part of the connecting member is moved downwardly to trigger the signal generator to generate a first signal. After the signal generator is triggered, the keycap assembly is continuously moved downwardly and the elastic element is moved downwardly to trigger the membrane switch to generate a second signal. The first signal and the second signal are different types of signals.

From the above descriptions, the present invention provides the keyboard device. After the keycap assembly is depressed, the keycap assembly is moved toward the plate assembly through the connecting member. While the keycap assembly is moved downwardly, the triggering part of the connecting member is correspondingly moved downwardly to trigger the signal generator to generate the first signal. After the signal generator is triggered, the keycap assembly is continuously moved downwardly. Consequently, the elastic element is moved downwardly to trigger the membrane switch to generate the second signal. In other words, one clicking action of the key structure can generate two different signals. Moreover, the key structure may be selectively triggered to generate one signal or two different signals according to the pressing force of the user. Consequently, the flexibility of using the keyboard device in different usage statuses will be enhanced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
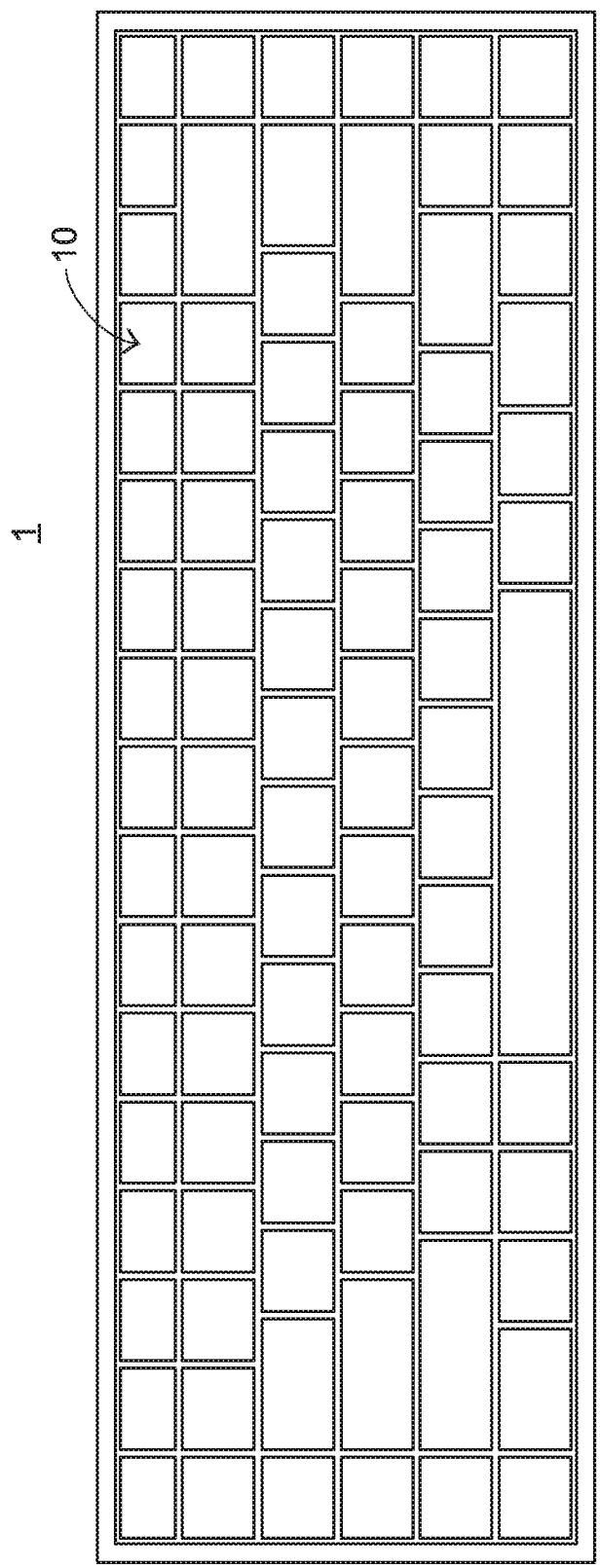
FIG. 1 is a schematic top view illustrating the outer appearance of a keyboard device according to an embodiment of the present invention.
Figure 2:
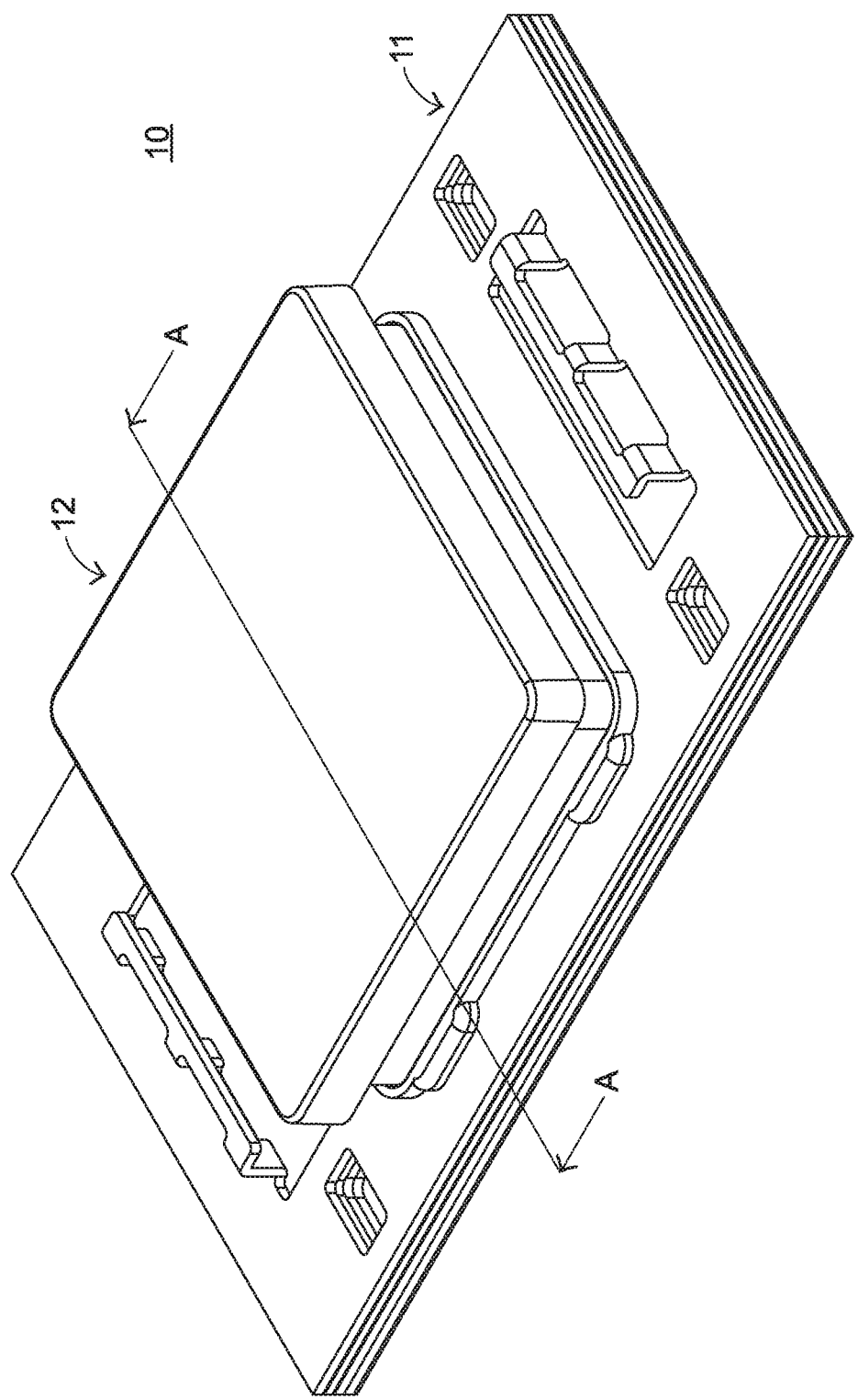
FIG. 2 is a schematic perspective view illustrating a key structure of the keyboard device as shown in FIG. 1.
Figure 3:
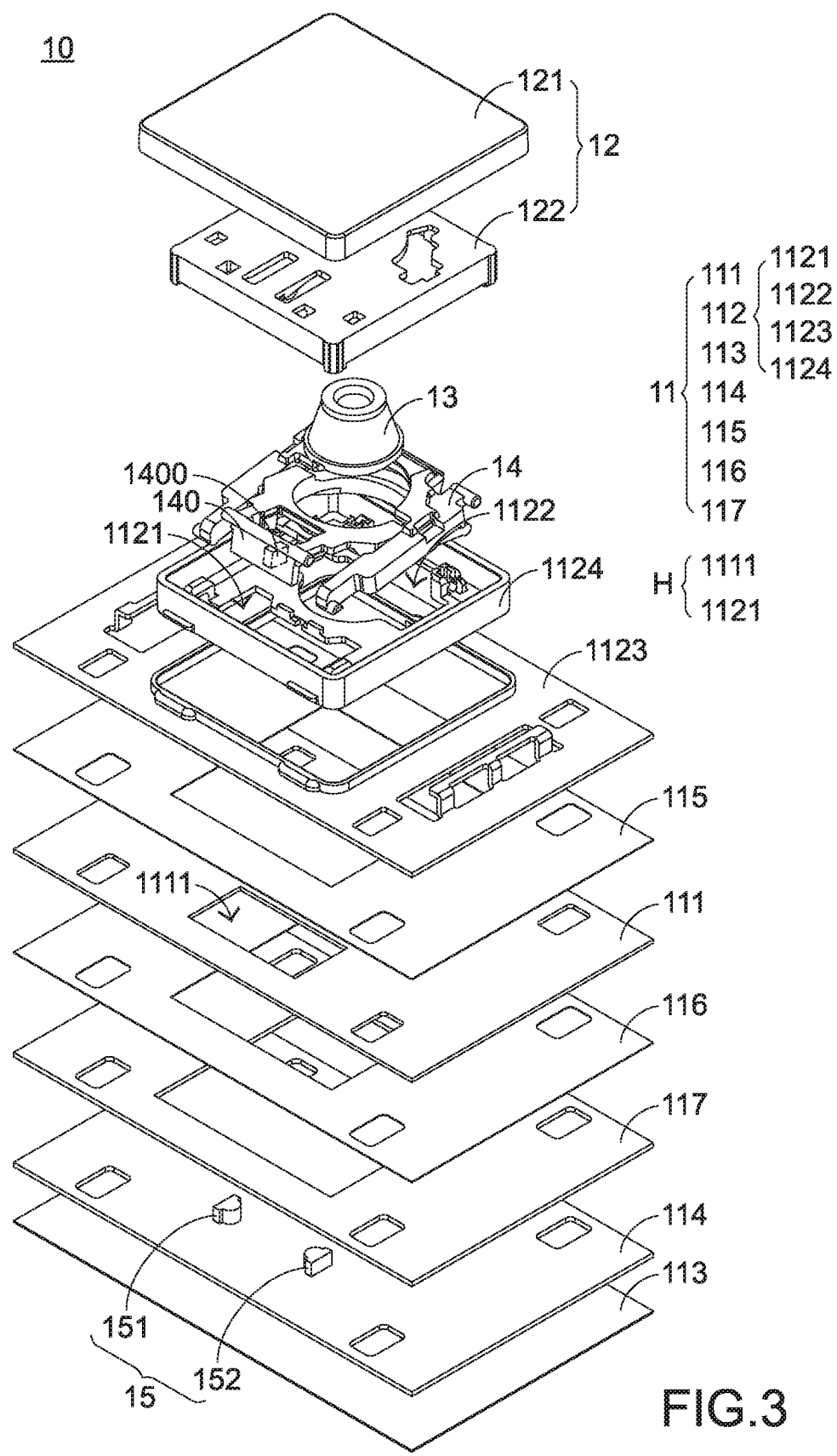
FIG. 3 is a schematic exploded view illustrating the key structure as shown in FIG. 2.
Figure 4:
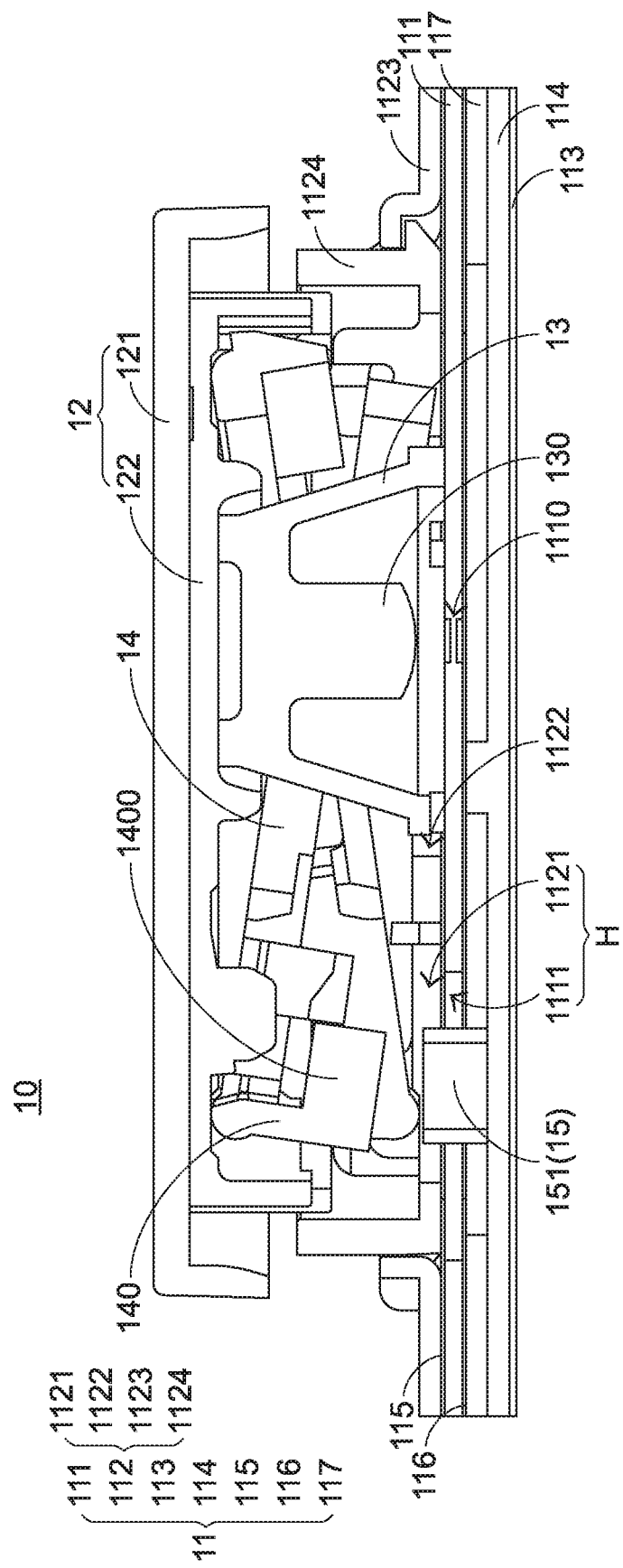
FIG. 4 is a schematic cross-sectional view illustrating the key structure as shown in FIG. 2 and taken along the line AA.
Figure 5:
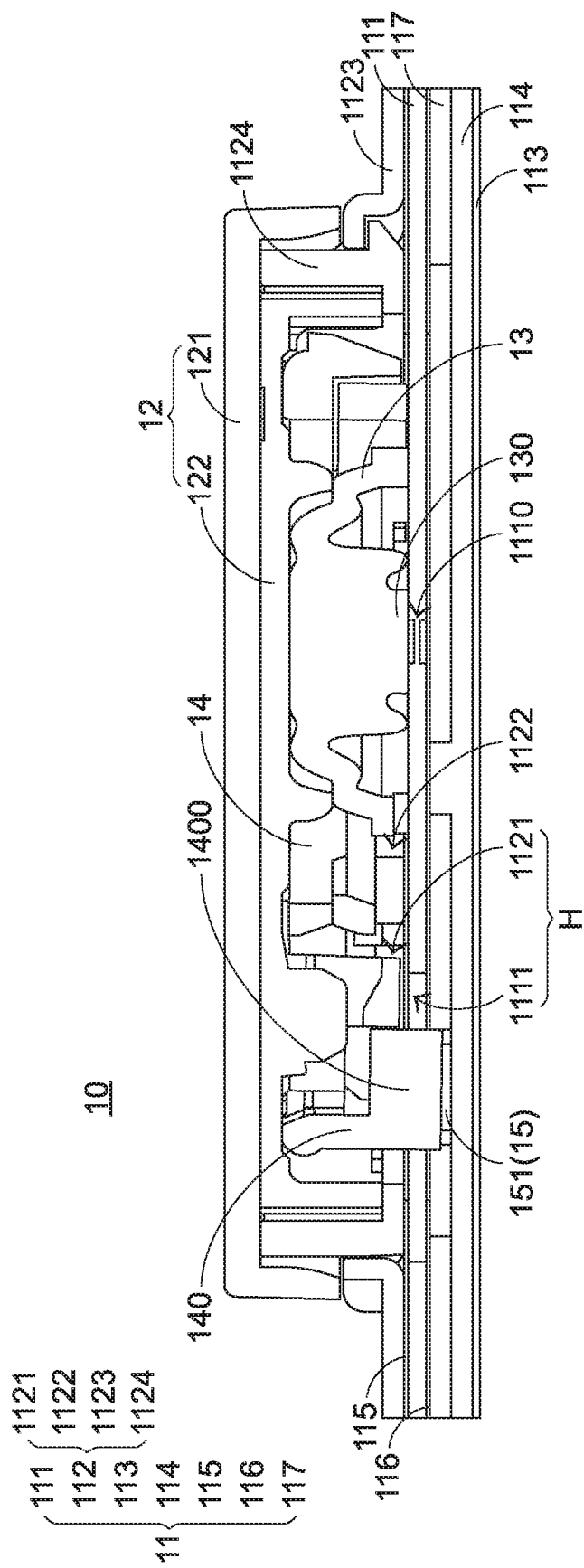
FIG. 5 is a schematic cross-sectional view illustrating the key structure of FIG. 4 in a depressed state, in which the signal generator is triggered.
Figure 6:
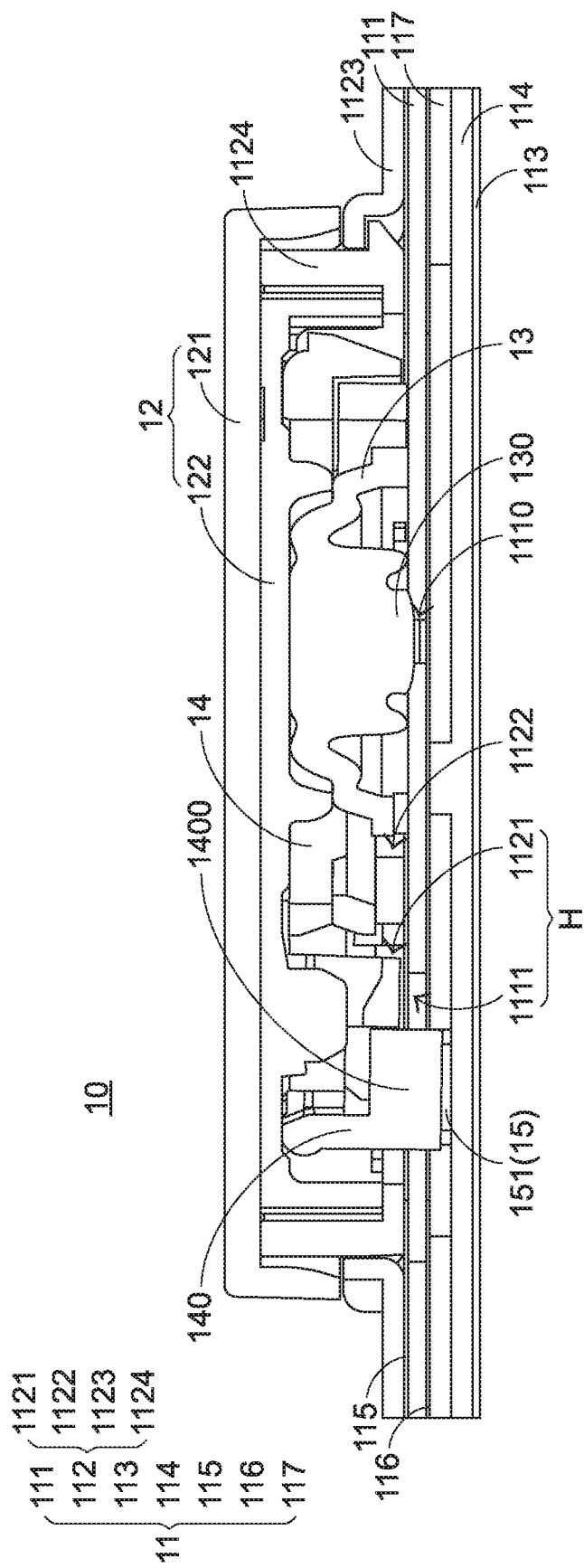
FIG. 6 is a schematic cross-sectional view illustrating the key structure of FIG. 4 in the depressed state, in which the membrane switch is further triggered.

Please refer to FIGS. 1, 2, 3, 4, 5 and 6. FIG. 1 is a schematic top view illustrating the outer appearance of a keyboard device according to an embodiment of the present invention. FIG. 2 is a schematic perspective view illustrating a key structure of the keyboard device as shown in FIG. 1. FIG. 3 is a schematic exploded view illustrating the key structure as shown in FIG. 2. FIG. 4 is a schematic cross-sectional view illustrating the key structure as shown in FIG. 2 and taken along the line AA. FIG. 5 is a schematic cross-sectional view illustrating the key structure of FIG. 4 in a depressed state, in which the signal generator is triggered. FIG. 6 is a schematic cross-sectional view illustrating the key structure of FIG. 4 in the depressed state, in which the membrane switch is further triggered.

As shown in FIG. 1, the keyboard device 1 comprises plural key structures 10. These key structures 10 are classified into some types, e.g., ordinary keys, numeric keys and function keys. When one of the key structures 10 is depressed by the user's finger, the keyboard device 1 generates a corresponding key signal to a computer, and thus the computer executes a corresponding function. For example, when an ordinary key is depressed, a corresponding English letter or symbol is inputted into the computer. When a numeric key is depressed, a corresponding number is inputted into the computer. In addition, the function keys (F1~F12) can be programmed to provide various quick access functions. Alternatively, the key further includes a Space key, a Shift key or any other similar multiple key with the larger area and length.

The key structure 10 of the keyboard device 1 will be described in more details as follows.

Please refer to FIGS. 2, 3, 4, 5 and 6 again. The key structure 10 comprises a plate assembly 11, a keycap assembly 12, an elastic element 13, a connecting member 14 and a signal generator 15. The plate assembly 11 comprises a membrane switch 1110. The keycap assembly 12 is located over the plate assembly 11. The elastic element 13 is arranged between the plate assembly 11 and the keycap assembly 12. The connecting member 14 is arranged between the plate assembly 11 and the keycap assembly 12. The connecting member 14 comprises a triggering part 140. The keycap assembly 12 is movable upwardly or downwardly relative to the plate assembly 11 through the connecting member 13. While the keycap assembly 12 is moved downwardly to compress the elastic element 13, the elastic element 13 is subjected to deformation to trigger the membrane switch 1110 on the plate assembly 11. Moreover, in response to the elastic restoring force of the elastic element 13, the keycap assembly 12 is moved upwardly and returned to its original position. Preferably but not exclusively, the connecting member 14 is a scissors-type connecting member. The signal generator 15 is installed on the plate assembly 11 and aligned with the triggering part 140 of the connecting member 14.

After the keycap assembly 12 is depressed, the keycap assembly 12 is moved toward the plate assembly 11 through the connecting member 14. While the keycap assembly 12 is moved downwardly, the triggering part 140 of the connecting member 14 is correspondingly moved downwardly to trigger the signal generator 15 to generate a first signal. After the signal generator 15 is triggered, the keycap assembly 12 is continuously moved downwardly. Consequently, the elastic element 13 is moved downwardly to trigger the membrane switch 1110 to generate a second signal. In other words, one clicking action of the key structure 10 can generate two different signals.

Please refer to FIGS. 2, 3, 4, 5 and 6 again. In an embodiment, the elastic element 13 comprises a contacting part 130. While the keycap assembly 12 is depressed and the keycap assembly 12 is moved downwardly through the connecting member 14, the keycap assembly 12 is moved downwardly to compress the elastic element 13. Consequently, the contacting part 130 is moved downwardly toward the plate assembly 11. After the signal generator 15 is triggered, the membrane switch 1110 is triggered by the contacting part 130 of the elastic element 13. Consequently, the second signal is generated.

Please refer to FIGS. 2, 3, 4, 5 and 6 again. In an embodiment, the plate assembly 11 comprises a membrane wiring board 111, a supporting assembly 112, a waterproof plate 113 and a circuit board 114. The membrane wiring board 111 comprises the membrane switch 1110 and a first opening 1111. The elastic element 13 is arranged between the membrane wiring board 111 and the keycap assembly 12. The supporting assembly 112 is located over the membrane wiring board 111. The supporting assembly 112 comprises a second opening 1121 and a third opening 1122. The waterproof plate 113 is located under the membrane wiring board 111. The circuit board 114 is arranged between the membrane wiring board 111 and the waterproof plate 113. The signal generator 15 is installed on the circuit board 114. From top to bottom, the supporting assembly 112, the membrane wiring board 111, the circuit board 114 and the waterproof plate 113 are stacked on each other sequentially. The second opening 1121 of the supporting assembly 112 and the first opening 1111 of the membrane wiring board 111 are in communication with each other to be collaboratively defined as an opening part H. The elastic element 13 is penetrated through the third opening 1122 of the supporting assembly 112 and installed on the membrane wiring board 111. The signal generator 15 is exposed to the opening part H and aligned with the triggering part 140 of the connecting member 14.

Please refer to FIGS. 2, 3, 4, 5 and 6 again. In an embodiment, the supporting assembly 112 is a combination of a supporting plate 1123 and a supporting frame 1124. The second opening 1121 and the third opening 1122 of the supporting assembly 112 are formed in the supporting frame 1124. In an embodiment, the keycap assembly 12 is a combination of a keycap 121 and a covering body 122. The covering body 122 of the keycap assembly 12 is embedded in the supporting frame 1124. Particularly, the covering body 122 is embedded in the inner periphery of the supporting frame 1124. While the keycap assembly 12 is moved upwardly or downwardly relative to the plate assembly 11, the keycap 121 along with the covering body 122 is moved upwardly or downwardly relative to the supporting frame 1124. In an embodiment, the connecting member 14 is arranged between the supporting frame 1124 and the covering body 122. Particularly, the supporting frame 1124 and the covering body 122 have coupling structures (e.g., hooks). The connecting member 14 is connected between the supporting frame 1124 and the covering body 122 through the coupling structures. The elastic element 13 is arranged between the covering body 122 and the membrane wiring board 111. While the keycap assembly 12 is moved downwardly relative to the plate assembly 11 to compress the elastic element 13, the elastic element 13 is subjected to deformation to trigger the membrane switch 1110 on the membrane wiring board 111.

Please refer to FIGS. 2, 3, 4, 5 and 6 again. In an embodiment, the plate assembly 11 further comprises a first adhesive layer 115, a second adhesive layer 116 and a separation layer 117. The first adhesive layer 115 is arranged between the supporting assembly 112 and the membrane wiring board 111. The second adhesive layer 116 is arranged between the membrane wiring board 111 and the separation layer 117. The separation layer 117 is arranged between the second adhesive layer 116 and the circuit board 114. Preferably but not exclusively, the first adhesive layer 115 and the second adhesive layer 116 are made of double-sided adhesive. The top surface of the first adhesive layer 115 is attached on the supporting plate 1123 of the supporting assembly 112. The bottom surface of the first adhesive layer 115 is attached on the membrane wiring board 111. Consequently, the supporting assembly 112 and the membrane wiring board 111 are combined together through the first adhesive layer 115. The top surface of the second adhesive layer 116 is attached on the membrane wiring board 111. The bottom surface of the second adhesive layer 116 is attached on the separation layer 117. Consequently, the membrane wiring board 111 and the separation layer 117 are combined together through the second adhesive layer 116.

Please refer to FIGS. 2, 3, 4, 5 and 6 again. In an embodiment, the signal generator 15 comprises an infrared emitter 151 and an infrared receiver 152. The infrared emitter 151 emits an infrared ray to the infrared receiver 152. The region between the infrared emitter 151 and the infrared receiver 152 is defined as a sensing region. In an embodiment, the triggering part 140 of the connecting member 14 comprises a light-shielding structure 1400. While the keycap assembly 12 is moved downwardly relative to the plate assembly 11 through the connecting member 14, the light-shielding structure 1400 of the connecting member 14 is correspondingly moved to the sensing region. Consequently, the signal generator 15 is triggered to generate the first signal.

Please refer to FIGS. 4, 5 and 6. The travel process of the key structure from the undepressed state to the depressed state are shown in FIGS. 4, 5 and 6. As shown in FIG. 5, the keycap assembly 12 is moved downwardly relative to the plate assembly 11 through the connecting member 14 after the key structure 10 is pressed down. During this process, the light-shielding structure 1400 of the triggering part 140 of the connecting member 14 is firstly moved to the sensing region between the infrared emitter 151 and the infrared receiver 152. Consequently, the signal generator 15 is triggered to generate the first signal. Since the membrane switch 1110 on the membrane wiring board 111 has not been triggered by the contacting part 130 of the elastic element 13 in this stage, the membrane switch 1110 does not generate the second signal in this stage. As shown in FIG. 6, the keycap assembly 12 is continuously moved downwardly after the signal generator 15 is triggered by the triggering part 140 of the connecting member 14. In this stage, the membrane switch 1110 on the membrane wiring board 111 is triggered by the contacting part 130 of the elastic element 13. Consequently, the membrane switch 1110 is triggered to generate the second signal, which is different from the first signal.

As mentioned above, the key structure 10 is specially designed. Consequently, one clicking action of the key structure 10 can generate two different signals. In an embodiment, the first signal generated by the signal generator 15 and the second signal generated by the membrane switch 1110 are two different control signals. For example, when the keyboard device 1 is used to control a game, the user may depress the key structure 10 to sequentially generate two different control signals to control the characters in the game. For example, the first control signal is firstly generated to control the character in the game to run, and the second control signal is then generated to control the character in the game to accelerate running. If the task of controlling the character in the game to run is sufficient but it is not necessary for the character to accelerate running, the user may depress the key structure 10 for the travel distance as shown in FIG. 5. In other words, the key structure 10 may selectively trigger only one control signal in response to a pressing force of the user.

In the above embodiment, the first signal generated by the signal generator 15 and the second signal generated by the membrane switch 1110 are two different control signals. It is noted that numerous modifications and alterations may be made while retaining the teachings of the invention. For example, in another embodiment, the first signal generated by the signal generator 15 is a sound signal, and the second signal generated by the membrane switch 1110 is a text input signal. The types of the first signal and the second signal are not restricted. When the user needs to generate one signal in response to one clicking action of the key structure 10, the user may selectively disable the signal generator 15 or the membrane switch 1110.

Figure 7:
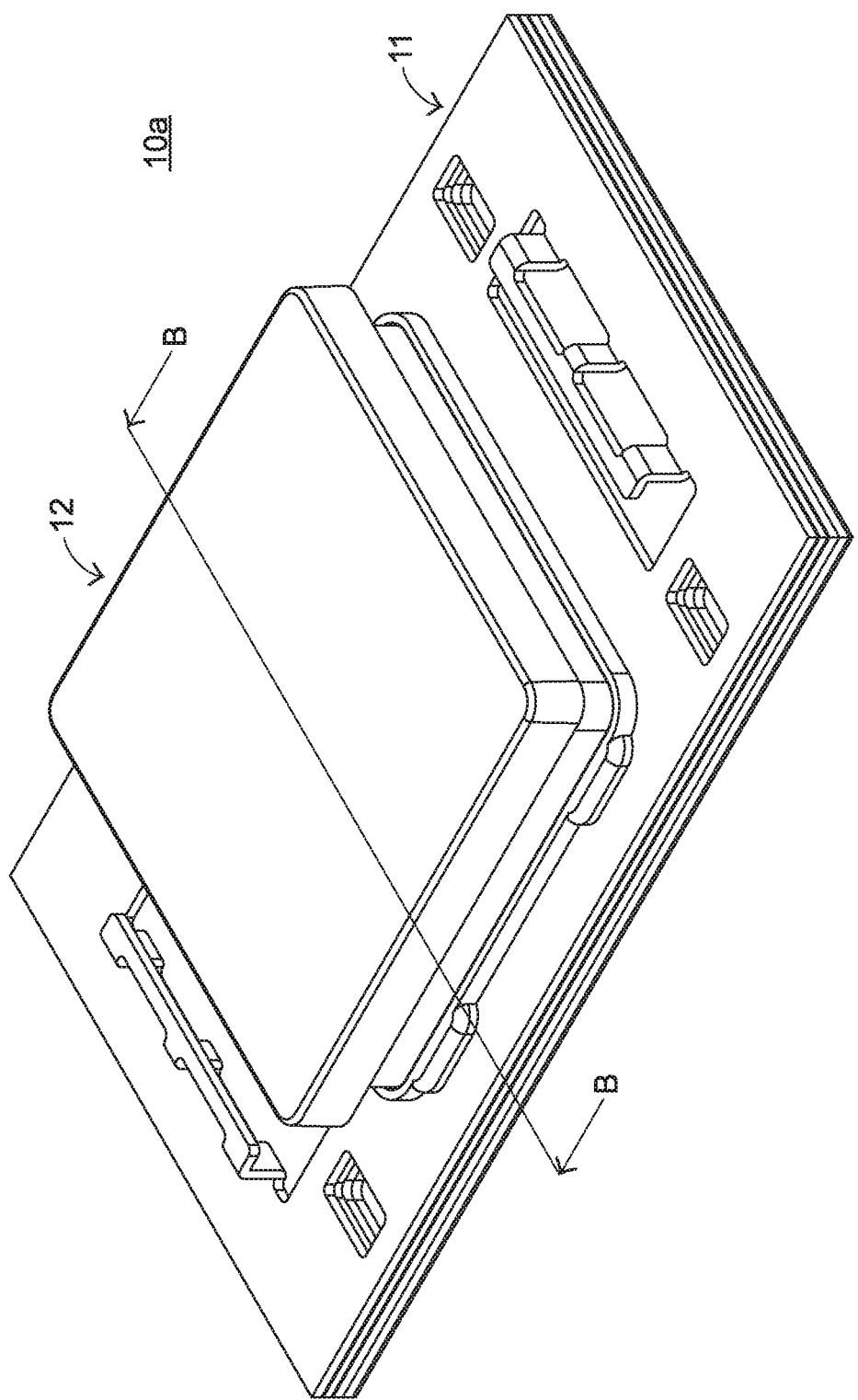
FIG. 7 is a schematic perspective view illustrating a key structure of a keyboard device according to another embodiment.
Figure 8:
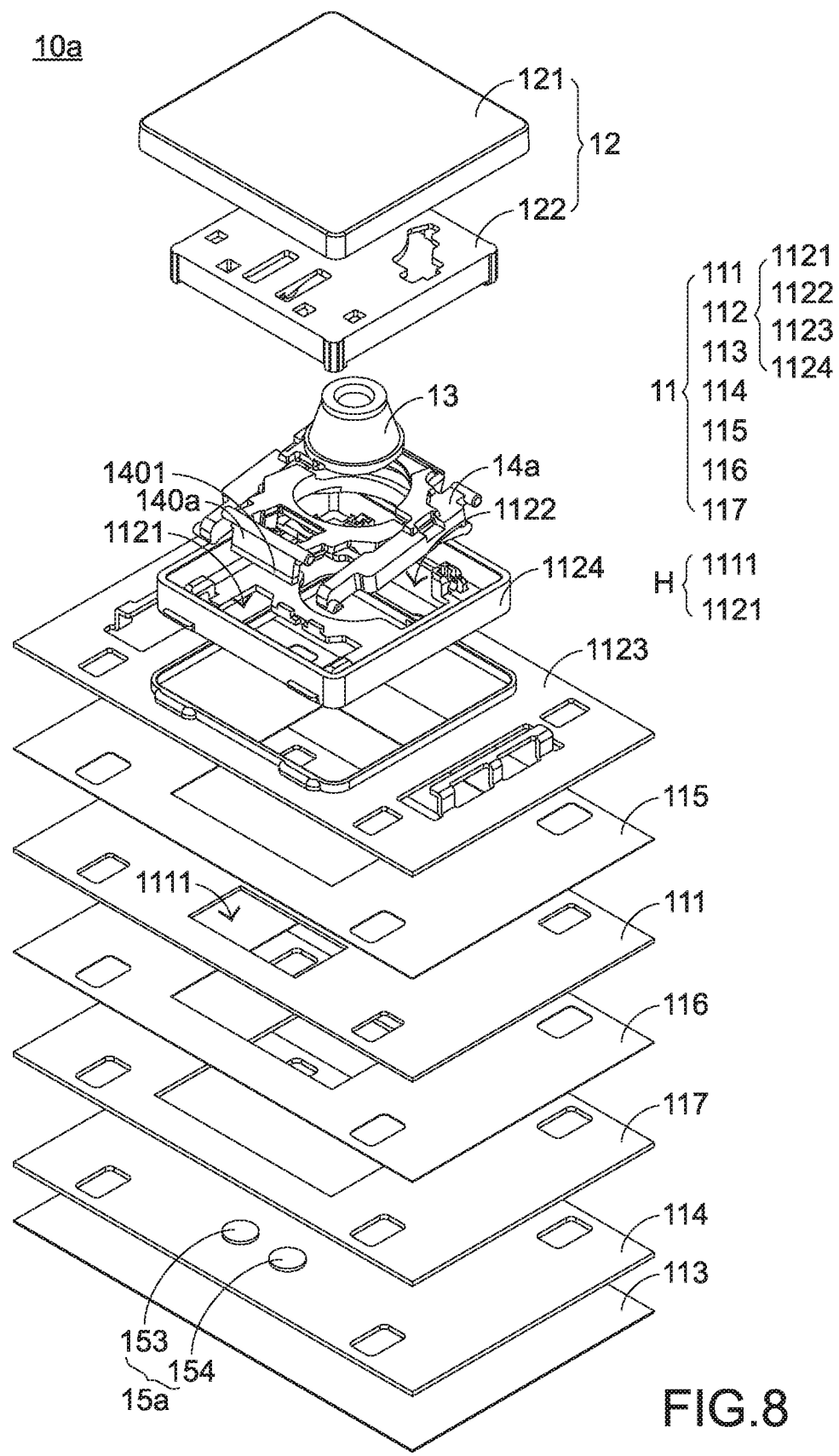
FIG. 8 is a schematic exploded view illustrating the key structure as shown in FIG. 7.
Figure 9:
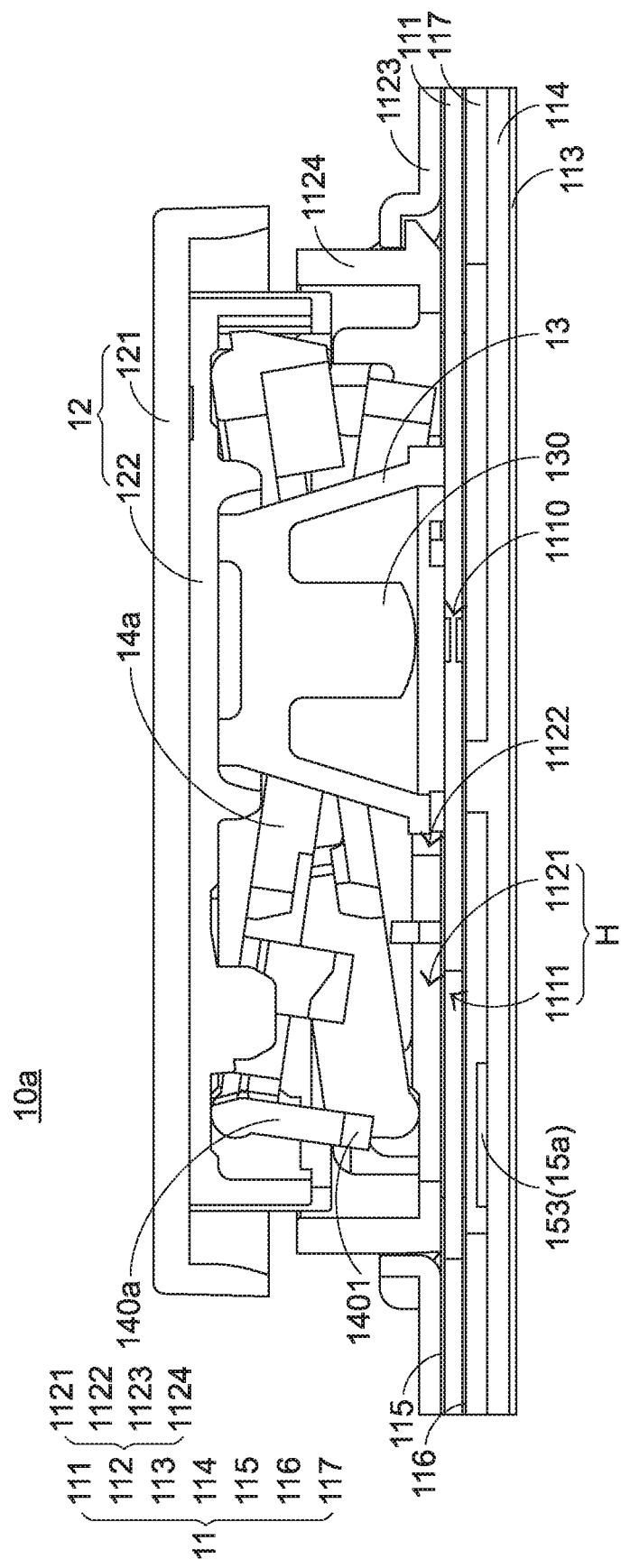
FIG. 9 is a schematic cross-sectional view illustrating the key structure as shown in FIG. 7 and taken along the line BB.
Figure 10:
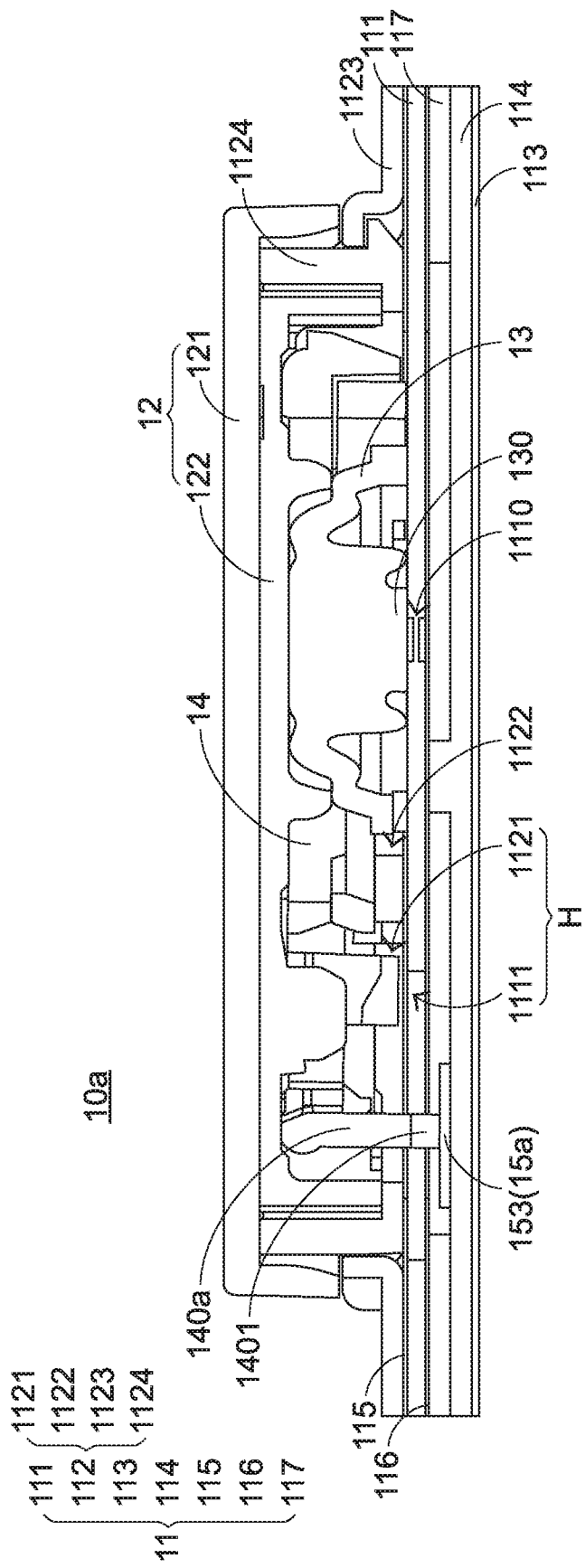
FIG. 10 is a schematic cross-sectional view illustrating the key structure of FIG. 9 in a depressed state, in which the signal generator is triggered.
Figure 11:
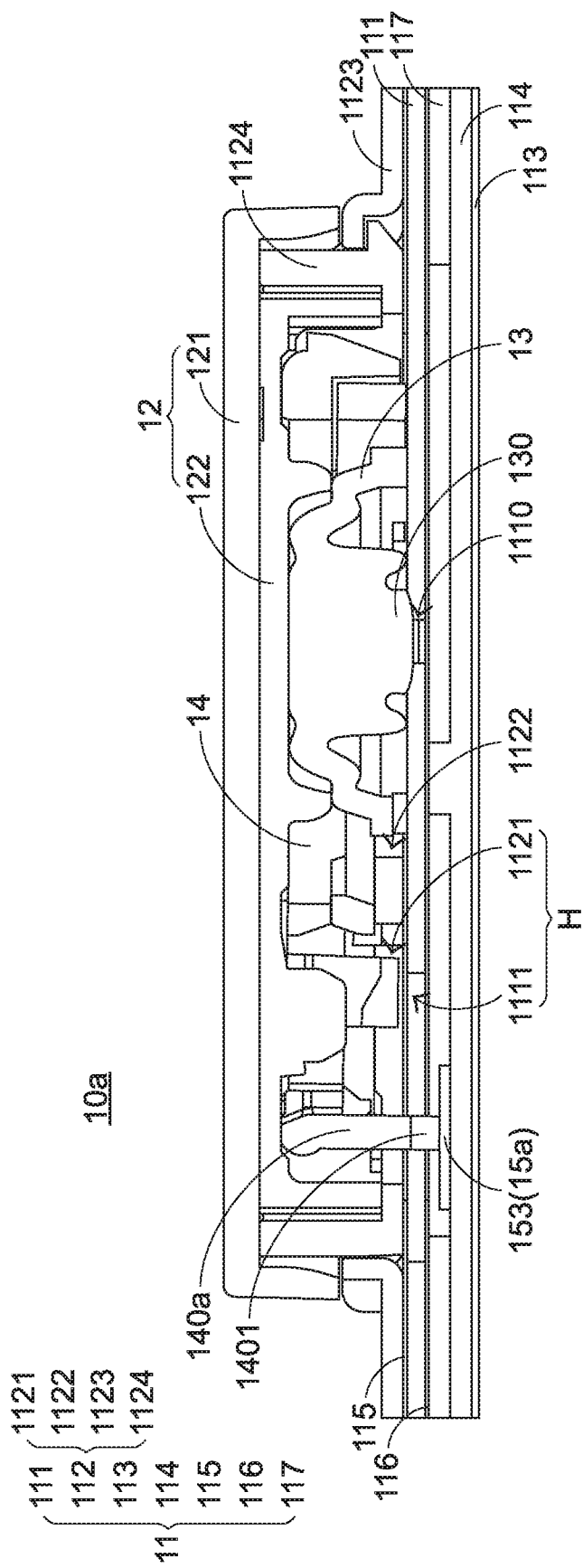
FIG. 11 is a schematic cross-sectional view illustrating the key structure of FIG. 9 in the depressed state, in which the membrane switch is further triggered.

Please refer to FIGS. 7, 8, 9, 10 and 11. FIG. 7 is a schematic perspective view illustrating a key structure of a keyboard device according to another embodiment. FIG. 8 is a schematic exploded view illustrating the key structure as shown in FIG. 7. FIG. 9 is a schematic cross-sectional view illustrating the key structure as shown in FIG. 7 and taken along the line BB. FIG. 10 is a schematic cross-sectional view illustrating the key structure of FIG. 9 in a depressed state, in which the signal generator is triggered. FIG. 11 is a schematic cross-sectional view illustrating the key structure of FIG. 9 in the depressed state, in which the membrane switch is further triggered.

In comparison with the key structure 10 as shown in FIGS. 2 to 6, the signal generator 15a of the key structure 10a in this embodiment is distinguished. The signal generator 15a comprises a first electrode 153 and a second electrode 154, which are aligned with each other. For example, the first electrode 153 is a positive electrode, and the second electrode 154 is a negative electrode. In this embodiment, the triggering part 140a of the connecting member 14a comprises a conductive block 1401. While the keycap assembly 12 is moved downwardly relative to the plate assembly 11 through the connecting member 14a, the conductive block 1401 of the connecting member 14a is correspondingly moved and contacted with the first electrode 153 and the second electrode 154. Since a conductive loop between the first electrode 153 and the second electrode 154 is established, the signal generator 15a is triggered to generate the first signal.

Please refer to FIGS. 9, 10 and 11. The travel process of the key structure from the undepressed state to the depressed state are shown in FIGS. 9, 10 and 11. As shown in FIG. 10, the keycap assembly 12 is moved downwardly relative to the plate assembly 11 through the connecting member 14a after the key structure 10 is pressed down. During this process, the conductive block 1401 of the triggering part 140a of the connecting member 14a is firstly moved and contacted with the first electrode 153 and the second electrode 154. Since the conductive loop between the first electrode 153 and the second electrode 154 is established, the signal generator 15a is triggered to generate the first signal. Since the membrane switch 1110 on the membrane wiring board 111 has not been triggered by the contacting part 130 of the elastic element 13 in this stage, the membrane switch 1110 does not generate the second signal in this stage. As shown in FIG. 11, the keycap assembly 12 is continuously moved downwardly after the signal generator 15a is triggered by the triggering part 140a of the connecting member 14a. In this stage, the membrane switch 1110 on the membrane wiring board 111 is triggered by the contacting part 130 of the elastic element 13. Consequently, the membrane switch 1110 is triggered to generate the second signal, which is different from the first signal.

From the above descriptions, the present invention provides the keyboard device. After the keycap assembly is depressed, the keycap assembly is moved toward the plate assembly through the connecting member. While the keycap assembly is moved downwardly, the triggering part of the connecting member is correspondingly moved downwardly to trigger the signal generator to generate the first signal. After the signal generator is triggered, the keycap assembly is continuously moved downwardly. Consequently, the elastic element is moved downwardly to trigger the membrane switch to generate the second signal. In other words, one clicking action of the key structure can generate two different signals. Moreover, the key structure may be selectively triggered to generate one signal or two different signals according to the pressing force of the user. Consequently, the flexibility of using the keyboard device in different usage statuses will be enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A keyboard device comprising plural key structures, wherein each key structure comprises:
    a plate assembly comprising a membrane switch;
    a keycap assembly located over the plate assembly;
    an elastic element arranged between the plate assembly and the keycap assembly;
    a scissors-type connecting member arranged between the plate assembly and the keycap assembly, wherein the keycap assembly is movable upwardly or downwardly relative to the plate assembly through the connecting member, and the connecting member comprises a triggering part; and
    a signal generator installed on the plate assembly and aligned with the triggering part of the connecting member, wherein the signal generator comprises an infrared emitter and an infrared receiver, which are aligned with each other, wherein the infrared emitter emits an infrared ray to the infrared receiver, and a region between the infrared emitter and the infrared receiver is defined as a sensing region, wherein the triggering part of the connecting member comprises a light-shielding structure, wherein while the keycap assembly is moved downwardly relative to the plate assembly through the connecting member, the light-shielding structure of the connecting member is correspondingly moved to the sensing region, so that the signal generator is triggered to generate the first signal, wherein while the keycap assembly is moved toward the plate assembly through the connecting member, the triggering part of the connecting member is moved downwardly to trigger the signal generator to generate a first signal, wherein after the signal generator is triggered, the keycap assembly is continuously moved downwardly and the elastic element is moved downwardly to trigger the membrane switch to generate a second signal, wherein the first signal and the second signal are different types of signals.

2. The keyboard device according to claim 1, wherein the elastic element comprises a contacting part, wherein while the keycap assembly is moved downwardly through the connecting member, the keycap assembly is moved downwardly to compress the elastic element, and the contacting part is moved downwardly toward the plate assembly, wherein after the signal generator is triggered, the membrane switch is triggered by the contacting part of the elastic element, so that the second signal is generated.

3. The keyboard device according to claim 1, wherein the first signal is a sound signal, and the second signal is a text input signal.

4. The keyboard device according to claim 1, wherein the first signal and the second signal are different control signals.

5. The keyboard device according to claim 1, wherein the plate assembly further comprises:
    a membrane wiring board comprising the membrane switch and a first opening, wherein the elastic element is arranged between the membrane wiring board and the keycap assembly;
    a supporting assembly located over the membrane wiring board, and comprising a second opening and a third opening, wherein the second opening and the first opening are in communication with each other to be collaboratively defined as an opening part, and the elastic element is penetrated through the third opening and installed on the membrane wiring board;
    a waterproof plate located under the membrane wiring board; and
    a circuit board arranged between the membrane wiring board and the waterproof plate, wherein the signal generator is installed on the circuit board, and the signal generator is exposed to the opening part.

6. The keyboard device according to claim 5, wherein the supporting assembly is a combination of a supporting plate and a supporting frame, and the second opening and the third opening are formed in the supporting frame, wherein the keycap assembly is a combination of a keycap and a covering body, and the covering body is embedded in the supporting frame, wherein the covering body is movable upwardly or downwardly relative to the supporting frame, the connecting member is arranged between the supporting frame and the covering body, and the elastic element is arranged between the covering body and the membrane wiring board.

7. The keyboard device according to claim 5, wherein the plate assembly further comprises a first adhesive layer, a second adhesive layer and a separation layer, wherein the first adhesive layer is arranged between the supporting assembly and the membrane wiring board, the second adhesive layer is arranged between the membrane wiring board and the separation layer, and the separation layer is arranged between the second adhesive layer and the circuit board.

8. A key structure comprising:
    a plate assembly comprising a membrane switch;
    a keycap assembly located over the plate assembly;
    an elastic element arranged between the plate assembly and the keycap assembly;
    a scissors-type connecting member arranged between the plate assembly and the keycap assembly, wherein the keycap assembly is movable upwardly or downwardly relative to the plate assembly through the connecting member, and the connecting member comprises a triggering part; and
    a signal generator installed on the plate assembly and aligned with the triggering part of the connecting member, wherein the signal generator comprises an infrared emitter and an infrared receiver, which are aligned with each other, wherein the infrared emitter emits an infrared ray to the infrared receiver, and a region between the infrared emitter and the infrared receiver is defined as a sensing region, wherein the triggering part of the connecting member comprises a light-shielding structure, wherein while the keycap assembly is moved downwardly relative to the plate assembly through the connecting member, the light-shielding structure of the connecting member is correspondingly moved to the sensing region, so that the signal generator is triggered to generate the first signal, wherein while the keycap assembly is moved toward the plate assembly through the connecting member, the triggering part of the connecting member is moved downwardly to trigger the signal generator to generate a first signal, wherein after the signal generator is triggered, the keycap assembly is continuously moved downwardly and the elastic element is moved downwardly to trigger the membrane switch to generate a second signal, wherein the first signal and the second signal are different types of signals.

* * * * *